United States Patent
Tamura

[19]
[11] Patent Number: 6,078,068
[45] Date of Patent: Jun. 20, 2000

[54] ELECTROSTATIC DISCHARGE PROTECTION BUS/DIE EDGE SEAL

[75] Inventor: Ronald Kazuo Tamura, San Jose, Calif.

[73] Assignee: Adaptec, Inc., Milpitas, Calif.

[21] Appl. No.: 09/116,434

[22] Filed: Jul. 15, 1998

[51] Int. Cl.[7] .................................................. H01L 27/10
[52] U.S. Cl. ..................... 257/203; 257/207; 257/210; 257/355; 438/128
[58] Field of Search .................................. 257/203, 210, 257/355, 207; 438/128

[56] References Cited

U.S. PATENT DOCUMENTS

| | | | |
|---|---|---|---|
| 4,559,579 | 12/1985 | Val | 361/220 |
| 4,893,168 | 1/1990 | Takahashi et al. | 357/68 |
| 4,945,395 | 7/1990 | Suehiro | 357/40 |
| 5,019,889 | 5/1991 | Yoshio et al. | 357/42 |
| 5,063,429 | 11/1991 | Crafts | 357/40 |
| 5,087,955 | 2/1992 | Futami | 357/41 |
| 5,347,150 | 9/1994 | Sakai et al. | 259/203 |
| 5,365,091 | 11/1994 | Yamagishi | 257/203 |
| 5,581,202 | 12/1996 | Yano et al. | 326/101 |
| 5,593,927 | 1/1997 | Farnworth et al. | 437/209 |
| 5,602,406 | 2/1997 | Okabe | 257/207 |
| 5,672,895 | 9/1997 | Iida et al. | 257/357 |
| 5,773,854 | 6/1998 | Pasch | 257/202 |
| 5,940,258 | 8/1999 | Duvvury | 361/56 |
| 5,955,764 | 9/1999 | Katsube | 257/355 |

OTHER PUBLICATIONS

Unknown, "Basics of Electrostatic Discharge Part One—An Introduction to ESD", Special to Compliance Engineering Magazine,© 1996, 1997, 1998, The ESD Association, Rome, NY.

Unknown, "Basics of Electrostatic Discharge Part Two—Principles of ESD Control", Special to Compliance Engineering Magazine, EOS/ESD Symposium Proceedings, 1980, The ESD Association, Rome, NY.

*Primary Examiner*—William Mintel
*Attorney, Agent, or Firm*—Martine Penilla & Kim, LLP

[57] ABSTRACT

Disclosed is an integrated circuit chip having an improved ESD protection structure. The integrated circuit chip includes a core logic region having a plurality of transistor devices that are interconnected to form a specific integrated circuit device. A plurality of input/output cells are defined along a periphery of the integrated circuit chip. An ESD bus die edge seal that defines a single ring around the periphery of the integrated circuit chip is provided. The ESD bus die edge seal is positioned outside of the plurality of input/output cells closest to a physical outer edge of the integrated circuit chip. Further, a plurality of (Vss) supply cells are contained in selected ones of the plurality of input/output cells. And, a plurality of ESD cross-coupled diodes are connected between the plurality of (Vss) supply cells and the ESD bus die edge seal. Advantageously, this combined ESD bus and die edge seal provides a more compact structure that also has more uniform charged contaminant collection characteristics.

22 Claims, 6 Drawing Sheets

ELECTROSTATIC DISCHARGE PROTECTION BUS/DIE EDGE SEAL

BACKGROUND OF THE INVENTION

1. Field of the Invention

This invention relates generally to integrated circuits, and more particularly to semiconductor devices having electrostatic discharge capabilities.

2. Description of the Related Art

Most integrated circuit applications have some type of electrostatic discharge (ESD) circuitry that is used to absorb and discharge high voltage electrostatic charges that can inadvertently destroy circuit devices that operate at relatively low voltage levels. Typically, ESD circuitry is designed in an input/output (I/O) cell that includes circuitry for applying signals from an I/O pad into a core circuitry region. The I/O cell also typically includes amplification circuitry for amplifying and driving signals that are generated within the core circuitry out to the I/O pad that may be coupled to a lead of a packaged device.

Typically, the electrostatic charge that is created and transferred by human handling is known to generate charges ranging up to 2,000 volts and greater (and up to about 1.3 Amps past a 1,500Ω resistor or more), which are then transferred (i.e., discharged) onto leads of the packaged device. Accordingly, most ESD circuits are required to absorb and discharge sufficiently high levels of charge that make up an ESD event. The model used to simulate these types of ESD events is commonly referred to as the human body model (HBM). When EDS circuits fail to absorb and discharge an ESD event, many types of catastrophic failures can occur, which include metal melting, junction breakdown, and oxide destruction. These type of failures are typically recognized right away, however, certain types of ESD damage can occur in the form of latent defects which can ultimately mature into complete or partial circuit malfunction.

FIG. 1A shows a top view of a semiconductor die 100 after it has been singulated from a semiconductor wafer. The semiconductor die 100 typically includes a core logic region 102 that is contained within a ring of input/output (I/O) cells 106. Each of the I/O cells 106 include a bond pad 108 that is used to interconnect the logic circuitry contained within the core logic region 102 and connections of a package in which the semiconductor die 100 will be contained. For example, a package may have a conductive lead connection 114 which will enable bond wires 116 to be connected between selected bond pads 108 and conductive lead connections 114. Typically, the I/O cells 106 will contain transistors which are wired to define electrostatic discharge (ESD) protection circuits, pre-driver circuits, driver circuits, input buffers, etc.

In order to meet the need for semiconductor devices that have high levels of ESD protection, the use of an ESD bus 120 has recently gained popularity. For example, when the conduction lead connection 114 provides a ground source (Vss) to a bond pad 108, the bond pad 108 is also connected to the ESD bus 120 through a ground isolation and conduction circuit 110. As will be described with reference to FIG. 1B below, the ESD bus 120 is needed in order to dissipate electrostatic charge when Vss bus cuts are implemented in order to separate different types of internal Vss buses.

Typically, a die edge seal 122 is also patterned along the periphery of a chip edge 104 of the semiconductor die. Normally, the die edge seal 122 is a metallization pattern that is formed at each metallization layer of an integrated circuit device. Accordingly, the die edge seal 122 will form a stacked plurality of metallization rings, one stacked over another, near the chip edge 104. The lowermost metallization ring of the die edge seal 122 is typically connected to the chip substrate via a suitable substrate connection. Therefore, the die edge seal 122 serves as a mechanical and electrical barrier to contaminants that may disrupt the operation of the semiconductor die 100.

FIG. 1B shows a more detailed diagram of a section of I/O cells 106 that are located along the periphery of the semiconductor die 100 of FIG. 1A. In this example, the chip edge 104 defines the boundary of the semiconductor die 100, and a plurality of conductive lead connections 114 are shown connected to bond pads 108 via bond wires 116. Also shown is the die edge seal 122 and the ESD bus 120. In this example, the ESD bus 120 is connected to selected bond pads 108 through the ground isolation and conduction circuit 110. These bond pads 108 are then respectively connected to selected internal Vss buses 130 and 130'.

In this illustration, conductive lead connection 114a provides a ground source (Vss) to the Vss bus 130. The Vss bus 130 is, in this example, a noisy Vss bus because it is connected to one or more larger transistors which are used in an ESD device 124. In a similar manner, conductive lead connection 114b may be used to provide a ground source (Vss) to another bond pad 108 that is connected to a Vss bus 130', which is a quiet Vss bus. As is well known in the art, Vss bus 130' is defined as quiet with respect to Vss bus 130 because it is routed among smaller transistors. Accordingly, the I/O cells 106 will commonly have more than one set of Vss and Vdd buses which provide ground and power to selected circuits of the I/O cells.

Because there are different types of Vss and Vdd buses running within the I/O cells 106, it is often necessary to physically separate the buses by implementing suitable "bus cuts" 128. In this manner, the noisy Vss and Vdd buses 130 and 132 will be isolated from the quiet Vss and Vdd buses 130' and 132'. Although bus cuts work well to isolate the different types of Vss and Vdd buses within the I/O cells 106, discharging electrostatic charge between one Vss bus and another Vss bus is quite difficult without using an ESD bus 120. For example, if the ESD bus 120 were not provided, the only conduction path for electrostatic charge would be through the substrate which is typically a highly resistive path (and would necessarily cause ESD damage). However, because the ESD bus 120 is coupled between the various Vss buses, any electrostatic charge that may be communicated to any one of the conductive lead connections will be discharged through the ESD bus and out of the chip via a neighboring conductive lead connection 114.

To elaborate further, assume that an ESD charge is inadvertently communicated onto the bond pad 108 from the ESD device 124. The ESD charge pictorially identified as 134 may travel from the bond pad 108 through the ground isolation and conduction circuit 110 to the ESD bus 120, through another ground isolation and conduction circuit 110, to another bond pad 108, and then discharged out to the conductive lead connection 114b via the bond wire 116.

For completeness, the I/O cells 106 also include many I/O transistors 125 which may be accessed through conductive lead connections, such as conductive lead connection 114c. The I/O transistors 125 are shown connected to the Vss bus 130 and Vdd bus 132, and is in communication with an I/O pre-driver control logic 126.

Although the use of an ESD bus 120 has been shown to be quite beneficial for discharging ESD event charges, they do require a good amount of die surface area in order to be formed along the entire periphery of the semiconductor die 100. Additionally, the die edge seal 122, which is connected to the substrate via a substrate connection 131, also has to be routed along the periphery of the semiconductor die 100. Because the cost of semiconductor devices is tied to the amount of semiconductor die used, it is of paramount importance to reduce the size of a semiconductor die without sacrificing the operational requirements of a given integrated circuit.

In view of the foregoing, there is a need for a more compact integrated circuit design that provides both the advantages of having an electrostatic discharge bus and a die edge seal, while simultaneously reducing the need for additional die surface area around the periphery of a semiconductor chip.

SUMMARY OF THE INVENTION

Broadly speaking, the present invention fills these needs by providing an integrated circuit chip incorporating an improved electrostatic discharge protection structure that enables reductions in chip size while providing improved functionality. It should be appreciated that the present invention can be implemented in numerous ways, including as a process, an apparatus, a system, a device, a method, or a computer readable medium. Several inventive embodiments of the present invention are described below.

In one embodiment, an integrated circuit chip having an improved ESD protection structure is disclosed. The integrated circuit chip includes a core logic region having a plurality of transistor devices that are interconnected to form a specific integrated circuit device. A plurality of input/output cells are defined along a periphery of the integrated circuit chip. An ESD bus die edge seal that defines a single ring around the periphery of the integrated circuit chip is provided. The ESD bus die edge seal is positioned outside of the plurality of input/output cells closest to a physical outer edge of the integrated circuit chip. Furthermore, a plurality of (Vss) supply cells are contained in selected ones of the plurality of input/output cells. And, a plurality of ESD cross-coupled diodes are connected between the plurality of (Vss) supply cells and the ESD bus die edge seal. Advantageously, this combined ESD bus and die edge seal provides a more compact structure that also has more uniform charged contaminant collection characteristics.

In another embodiment, an electrostatic discharge protected integrated circuit chip is disclosed. The integrated circuit chip includes a core logic region having a plurality of transistor devices and a plurality of input/output cells that define a ring along a periphery of the integrated circuit chip. The input/output cells have circuitry for communicating signals into and out of the core logic region. The integrated circuit chip further includes an ESD bus die edge seal that defines a metallization ring around the periphery of the integrated circuit chip. The ESD bus die edge seal is positioned outside of the plurality of input/output cells closest to a physical outer edge of the integrated circuit chip. A plurality of (Vss) supply cells that are isolated from one another by bus-cuts and are contained in selected ones of the plurality of input/output cells are also included. Furthermore, the electrostatic discharge protected integrated circuit chip has a plurality of conduction and isolation circuits that are interconnected between the plurality of (Vss) supply cells and the ESD bus die edge seal, such that each of the plurality of (Vss) supply cells are separated from the ESD bus die edge seal by no more than a diode voltage difference.

In yet another embodiment, an integrated circuit chip having a core logic region that includes a plurality of transistor devices that are interconnected to form a specific integrated circuit device, and plurality of input/output cells that are defined along a periphery of the integrated circuit chip is disclosed. The integrated circuit chip includes a single bus means for providing ESD protection and die sealing functions. The single bus means is defined around the periphery of the integrated circuit chip, and the single bus means is positioned outside of the plurality of input/output cells closest to a physical outer edge of the integrated circuit chip. The integrated circuit chip further includes a plurality of (Vss) supply cells that are contained in selected ones of the plurality of input/output cells, and a plurality of ESD cross-coupled diodes that are connected between the plurality of (Vss) supply cells and the single bus means.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for an integrated circuit chip incorporating an improved electrostatic discharge protection structure. It will be obvious, however, to one skilled in the art, that the present invention may be practiced without some or all of these specific details. In other instances, well known process operations have not been described in detail in order not to unnecessarily obscure the present invention.

Figure 1A:
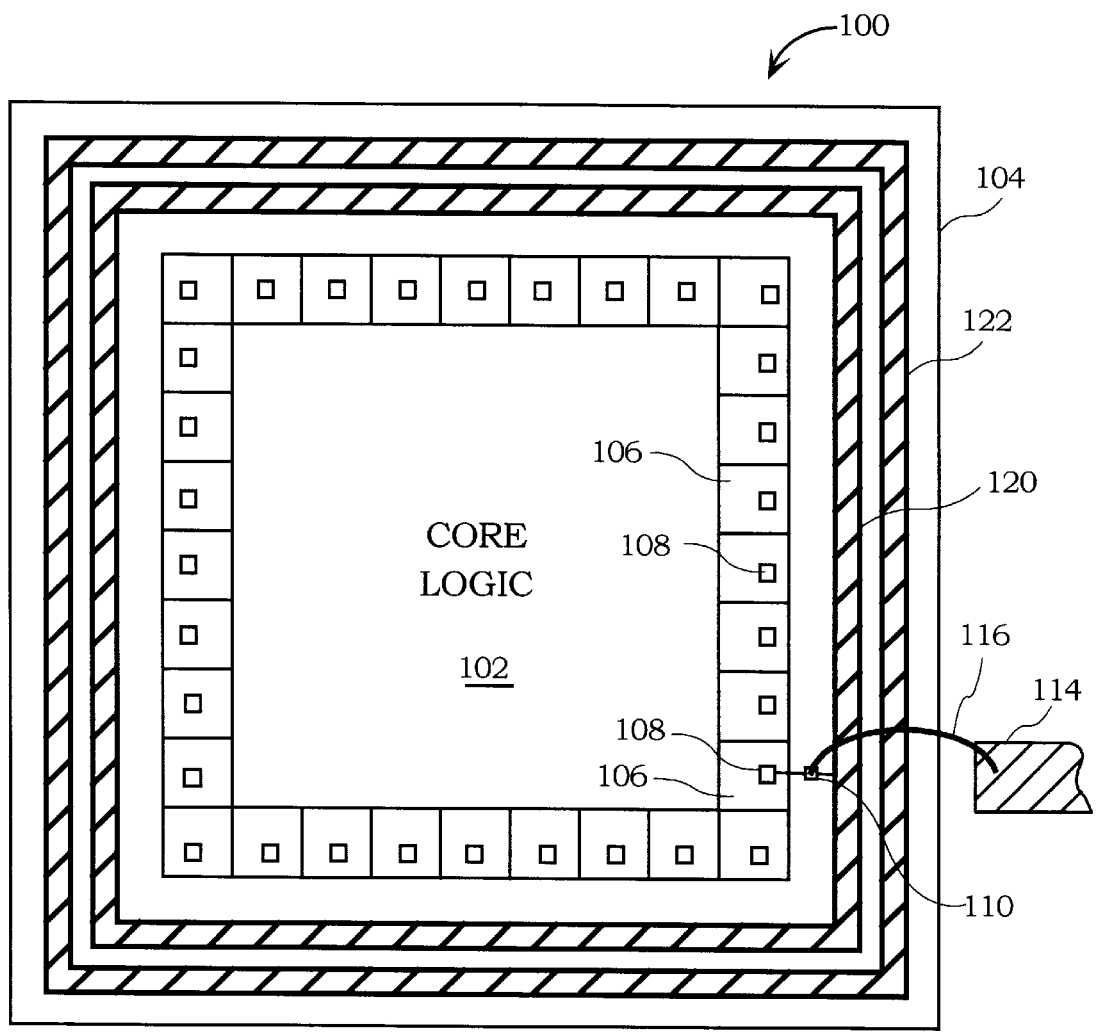
FIG. 1A shows a top view of a semiconductor die 100 after it has been singulated from a semiconductor wafer.
Figure 1B:
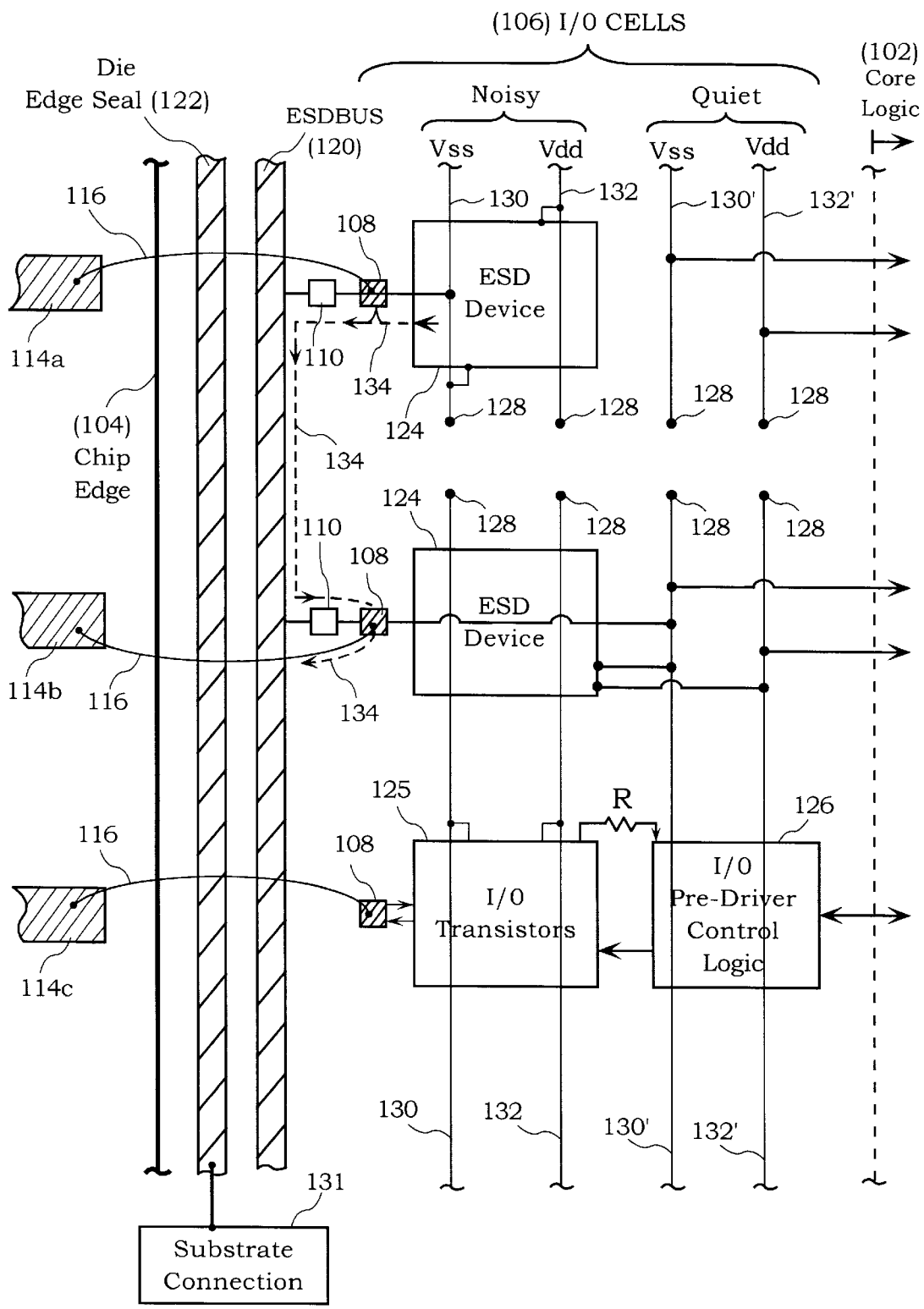
FIG. 1B shows a more detailed diagram of a section of I/O cells that are located along the periphery of the semiconductor die of FIG. 1A.
Figure 2:
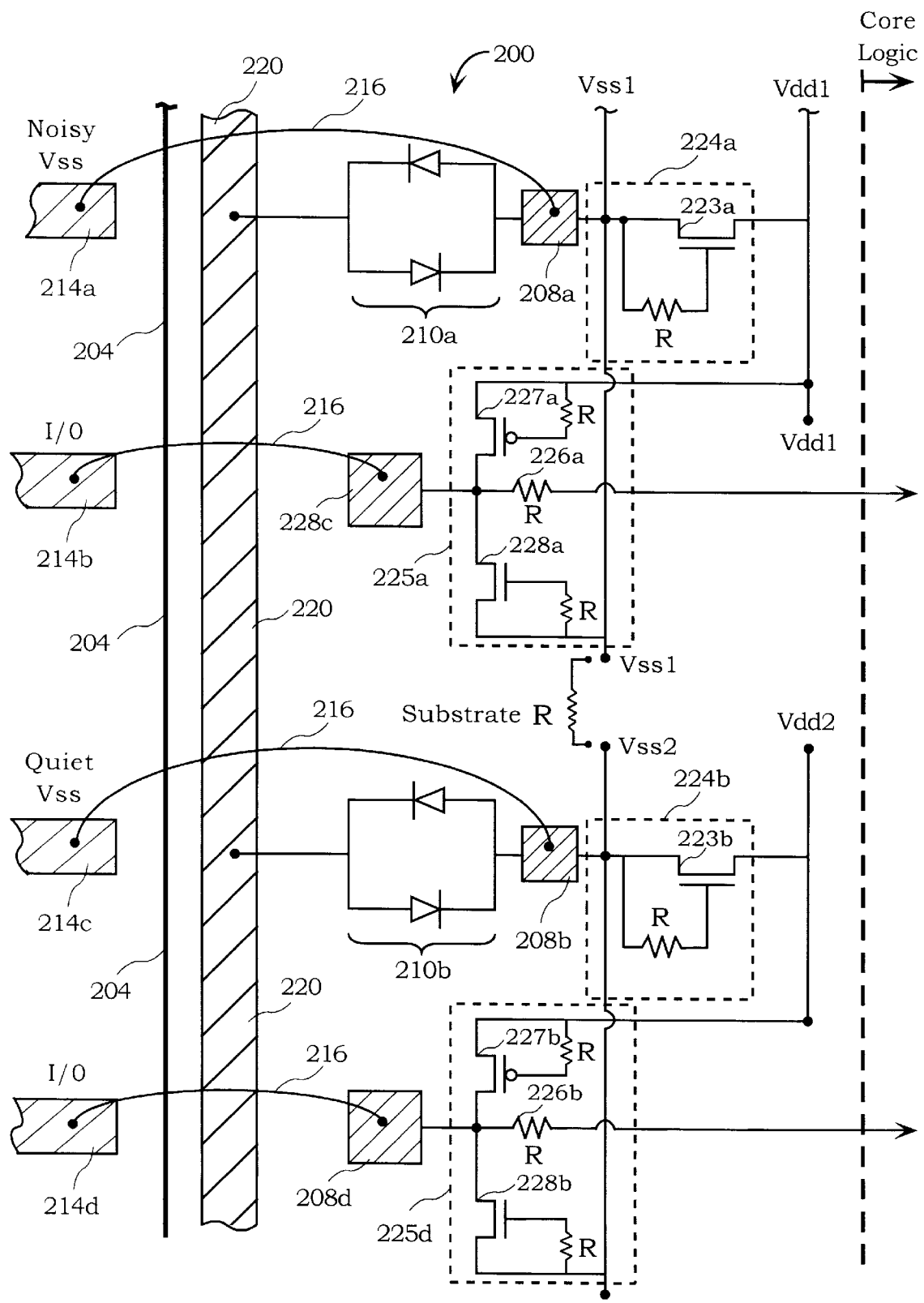
FIG. 2 shows input/output (I/O) circuitry that may be defined along the periphery of a given semiconductor die in accordance with one embodiment of the present invention.

FIG. 2 shows input/output (I/O) circuitry 200 that may be defined along the periphery of a given semiconductor die in accordance with one embodiment of the present invention. The semiconductor die has a chip edge 204 that defines the outer physical boundary of the semiconductor die, and also shown for ease of illustration, a plurality of conductive lead contacts 214 (of a semiconductor package) which are wired to selected bond pads 208 via bond wires 216. In this example, a noisy Vss is provided through conductive lead contact 214a to a bond pad 208a. The bond pad 208a is coupled to an ESD bus die edge seal 220 through ESD cross-couple diodes 210a. In this embodiment of the present invention, the ESD bus die edge seal 220 is provided as a single metallization structure that is defined as a ring along the periphery of a semiconductor die.

Although shown as only one metallization line here for simplicity, the ESD bus die edge seal 220 is actually repeated at each metallization layer in an integrated circuit device to provide a sufficient amount of mechanical support as well as a good electrical barrier to contaminants. One advantage of combining the ESD bus and the die edge seal of the prior art into a single ESD bus die edge seal 220 is that chip surface area can be saved and an integrated circuit device can be fabricated on a smaller physical chip.

The bond pad 208 is shown connected to an ESD device 224a which contains an N-channel MOSFET 223a that has its gate connected to a Vss 1 bus through a resistor R. Although only one N-channel MOSFET transistor 223a has been shown for ease of description, the ESD device 224a may incorporate additional N-channel MOSFETS to meet the desired ESD performance of a given integrated circuit device. Typically, the N-channel MOSFET 223a functions as an ESD voltage supply clamp between Vss 1 and Vdd 1.

Further shown is an I/O connection made from conductive lead connection 214b to bond pad 208c via a bond wire 216. The bond pad 208c connects up to I/O circuitry 225a. In this example, the I/O circuitry 225a includes a P-channel transistor 227a which has its gate connected through a resistor to Vdd 1. Also included in the I/O circuitry 225a is an N-type transistor 228a which has its gate connected to Vss 1 through a resistor. Although transistor 227a is shown to be a P-channel MOSFET, it can also be an N-channel MOSFET, a floating well P-channel MOSFET, or no device at all. Generally, a signal communicated into the core logic through bond pad 208 passes through a resistor 226a that is contained within I/O circuitry 225a.

Still referring to FIG. 2, a conductive lead connection 214c is shown providing a quiet Vss source to a bond pad 208b. The bond pad 208b is coupled to the ESD bus die edge seal 220 via ESD cross-coupled diodes 210b. Further, bond pad 208b is coupled to an ESD device 224b as discussed above. However, ESD device 224b is coupled between a Vss 2 and Vdd 2 which are quiet with respect to Vss 1 and Vdd 1. An I/O connection is also provided through conductive lead connection 214d to a bond pad 208d that communicates to I/O circuitry 225b as discussed above. If the ESD bus die edge seal 220 were not provided, the only connection between Vss 1 and Vss 2 would be through the substrate, which is a highly resistive "R" path. Consequently, an ESD event charge communicated through one conductive lead connection onto a particular bond pad 208 would result in sizable voltage drop across this substrate resistance, which would cause damage to the integrated circuit devices (e.g., which are typically very small interconnected transistor devices).

However, because the ESD bus die edge seal 220 is connected to each Vss source, whether it be a noisy or quiet Vss source, charge may be rapidly dissipated through the ESD bus among the various Vss sources. It should also be noted that the ESD bus die edge seal 220 is electrically connected to other Vss cells around the chip through the ESD cross-couple diodes 210. Thus, the ESD bus die edge seal 220 is only a "diode drop" (i.e., about 0.67 volts) away from each Vss cell of the integrated circuit device. This advantageously results in a more uniform potential distribution around the ESD bus die edge seal 220 as it goes around the chip, which also leads to improved chip reliability.

It should be noted that the prior art die edge seal could not provide a connection to each Vss pad because that would provide direct electrical communication between the different types of Vss pads. This is not desirable because this would result in voltage drops along the die edge seal, which has the unfortunate effect of causing non-uniform potential distributions.

Figure 3A:
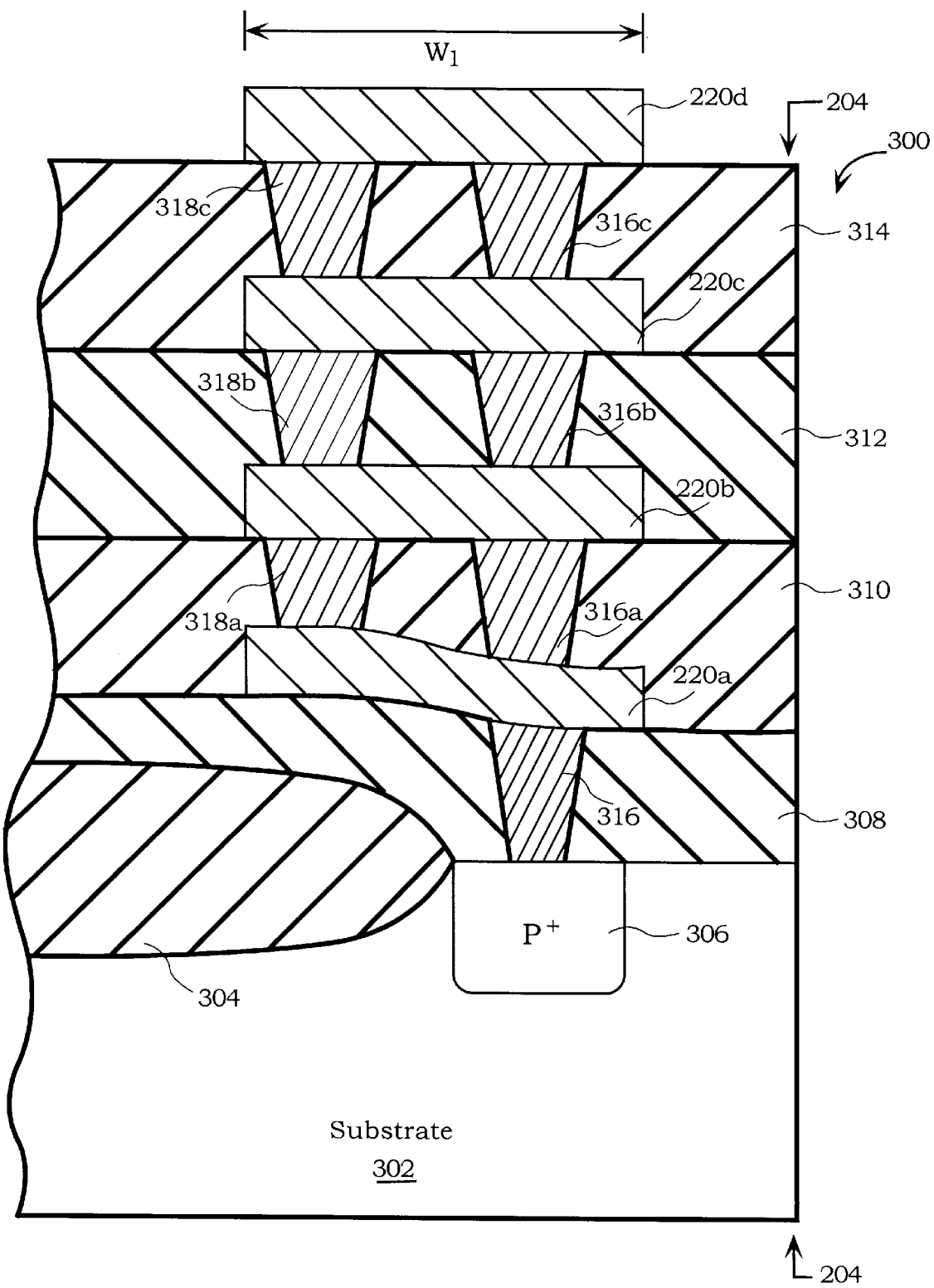
FIGS. 3A–3B show cross-sectional views of semiconductor dies incorporating the ESD bus die edge seal in accordance with one embodiment of the present invention.

FIG. 3A shows a cross-sectional view of a semiconductor die 300 incorporating the ESD bus die edge seal 220 in accordance with one embodiment of the present invention. As shown, the ESD bus die edge seal 220 is patterned at each metallization layer 220a, 220b, 220c, and 220d as rings that surround the plurality of input/output cells of the semiconductor die. The semiconductor die 300 has a substrate 302 which has a P+ substrate contact 306 and a field oxide region 304. Deposited over the field oxide region 304 and the substrate 302 is an oxide layer 308 which has a contact 316 defined therein to make electrical connection with a lowermost ring of the ESD bus die edge seal 220a.

Also shown are oxide layers 310, 312, and 314 which have conductive vias 316a, 316b, 316c, 318a, 318b, and 318c. Each of the conductive vias are configured to electrically interconnect each of the ESD bus die edge seals 220 of each successive metallization layer. As an advantage, because the die edge seal is integrally part of the ESD bus, undesirable charged ionic contaminants that may migrate from outside the chip boundary 204 may now be channeled and attracted to the respective Vss connections that are provided via the ESD cross-coupled diodes 210. In one embodiment, the width of each ring of the ESD bus die edge seal 220 will preferably have a width W. that is between about 4 microns and 40 microns, and more preferably between about 6 microns and 30 microns for a 0.35 micron technology device.

Figure 3B:
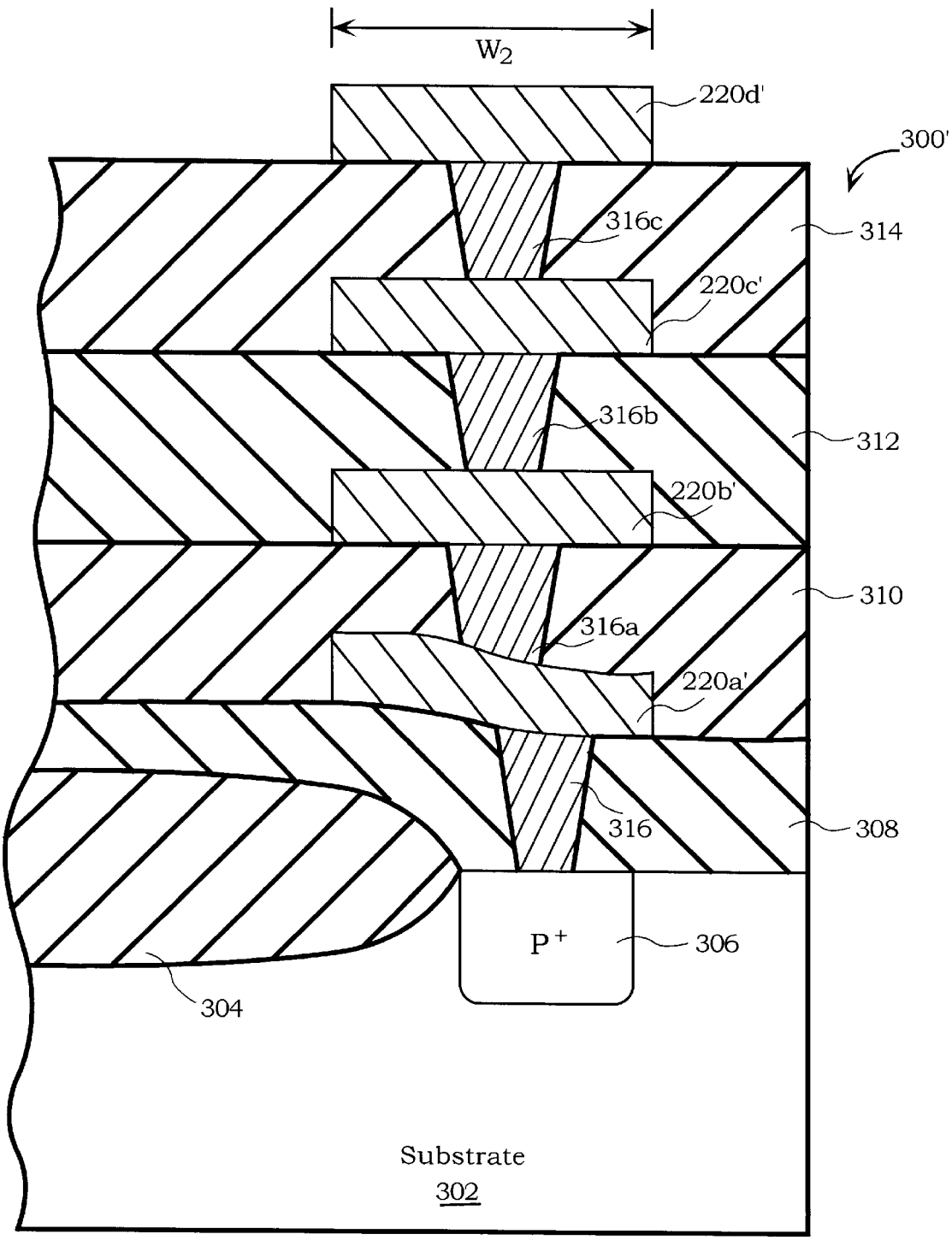

FIG. 3B shows a semiconductor die 300' which utilizes a narrower ESD bus die edge seal 220' in accordance with one embodiment of the present invention. The narrower ESD bus die edge seal 220' having a width $W_2$ may have widths ranging between about 4 microns and about 40 microns, and more preferably between about 6 microns and about 30 microns for a 0.35 micron technology device. In this embodiment, the conductive vias 318 have been removed in order to reduce the physical size of the ESD bus die edge seal 220' (provided the conductance is high enough) and further reduce the size of the semiconductor die 300'.

By implementing these preferred widths, the semiconductor die 300/300' will be able to withstand electrostatic discharge events having high voltages equivalent to those required to pass standard human body model (HBM) tests. Furthermore, although these exemplary dimensions have been provided for 0.35 micron technology devices, the combined ESD bus and die edge seal of the present invention is equally applicable to other micron technology devices, including devices that are larger than 0.35 microns (i.e., 0.6 micron products) and devices smaller than 0.35 microns.

Figure 4:
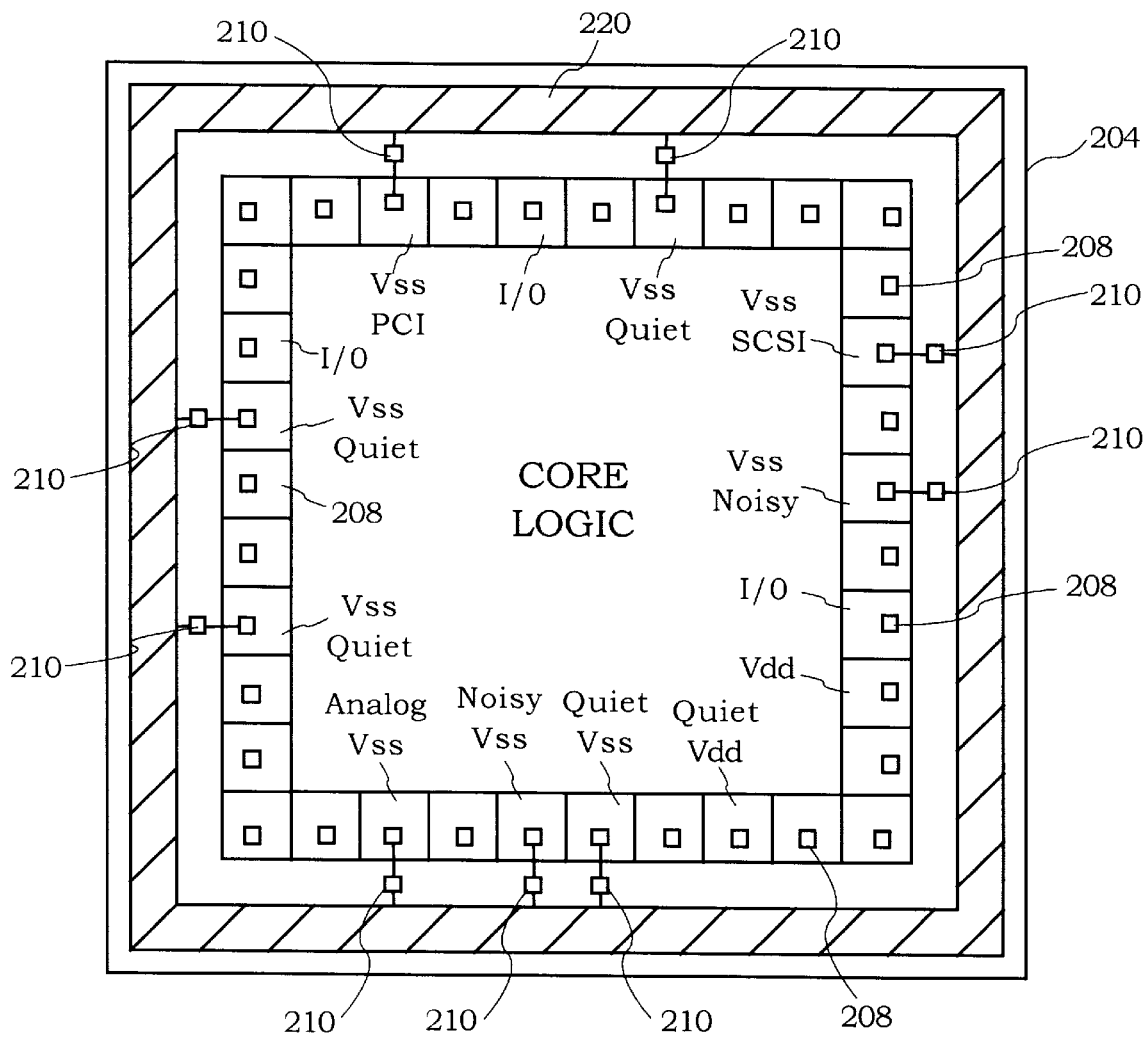
FIG. 4 shows a top view of a semiconductor die having the ESD bus die edge seal in accordance with one embodiment of the present invention.

FIG. 4 shows a top view of a semiconductor die having the ESD bus die edge seal 220 in accordance with one embodiment of the present invention. As illustrated, the ESD bus die edge seal 220 is defined as a single ring around the periphery of the die, and is coupled to selected I/O cells via ESD cross-coupled diodes 210. In this example, all Vss cells are connected to the ESD bus die edge seal 220 in order to provide an efficient charge dissipation path to protect against high voltage ESD events that may be introduced during fabrication, packaging or even after the devices are shipped and integrated into products. Furthermore, because all of the Vss cells are connected to the ESD bus die edge seal 220, each of the Vss cells are only a diode drop away from the ESD bus die edge seal 220. As can be appreciated, this results in a more uniform potential distribution around the chip, which results in improved ESD chip reliability. In addition, any charge contaminants that are communicated to the ESD bus die edge seal 220 will be more uniformly collected around the chip and then advantageously routed out of the chip through the Vss cells. Of course, this is not possible with the prior art die edge seal structures.

It is also important to note that there are many types of Vss cells that can take advantage of the ESD bus die edge seal 220 of the present invention. For example, such Vss cells may include the aforementioned quiet Vss cells, noisy Vss cells, and other Vss cells including SCSI Vss cells, PCI Vss cells, analog Vss cells, and the like. Also shown for completeness are a number of Vdd cells that are used to provide power to the core logic of the integrated circuit device and other input/output cells.

Although the foregoing invention has been described in some detail for purposes of clarity of understanding, it will be apparent that certain changes and modifications may be practiced within the scope of the appended claims. It should therefore be understood that the various circuit diagrams and semiconductor device diagrams may be embodied in any form which may include, for example, any suitable semiconductor substrate. The semiconductor devices may also be fabricated onto application specific integrated circuit (ASIC) chips, such as SCSI controller chips and network interfacing chips, which may then be packaged and integrated onto a printed circuit board. Accordingly, the present embodiments are to be considered as illustrative and not restrictive, and the invention is not to be limited to the details given herein, but may be modified within the scope and equivalents of the appended claims.

What is claimed is:

1. An integrated circuit chip, comprising:
   a core logic region having a plurality of transistor devices that are interconnected to form a specific integrated circuit device;
   a plurality of input/output cells being defined along a periphery of the integrated circuit chip;
   an ESD bus die edge seal defining a ring around the periphery of the integrated circuit chip, the ESD bus die edge seal is positioned outside of the plurality of input/output cells closest to a physical outer edge of the integrated circuit chip;
   a plurality of (Vss) supply cells contained in selected ones of the plurality of input/output cells; and
   a plurality of ESD cross-coupled diodes being connected between the plurality of (Vss) supply cells and the ESD bus die edge seal.

2. An integrated circuit chip as recited in claim 1, wherein selected ones of the plurality of (Vss) supply cells are connected to different internal Vss buses within the plurality of input/output cells to define different types of (Vss) supply cells.

3. An integrated circuit chip as recited in claim 2, wherein the different types of (Vss) cells are selected from a group consisting of a noisy Vss cell, a quiet Vss cell, a PCI Vss cell, a SCSI Vss cell, and an analog Vss cell.

4. An integrated circuit chip as recited in claim 3, wherein each of the different types of (Vss) cells are connected to the ESD bus die edge seal through selected ones of the ESD cross-coupled diodes.

5. An integrated circuit chip as recited in claim 3, wherein the different types of (Vss) cells are separated from one another by associated bus cuts.

6. An integrated circuit chip as recited in claim 1, wherein the ESD bus die edge seal is a single metallization ring.

7. An integrated circuit chip as recited in claim 6, wherein one layer of the single metallization ring is provided on a respective metallization level of the integrated circuit chip.

8. An integrated circuit chip as recited in claim 1, wherein the ESD bus die edge seal is electrically connected to a substrate of the integrated circuit chip via a conductive contact.

9. An integrated circuit chip as recited in claim 1, wherein respective ones of the plurality of input/output cells contain input/output circuits.

10. An integrated circuit chip as recited in claim 1, wherein the plurality of (Vss) supply cells are coupled to one or more ESD N-channel transistors.

11. An electrostatic discharge protected integrated circuit chip, comprising:
    a core logic region having a plurality of transistor devices;
    a plurality of input/output cells defining a ring along a periphery of the integrated circuit chip, the input/output cells having circuitry for communicating signals into and out of the core logic region;
    an ESD bus die edge seal defining a metallization ring around the periphery of the integrated circuit chip, the ESD bus die edge seal is positioned outside of the plurality of input/output cells closest to a physical outer edge of the integrated circuit chip;
    a plurality of (Vss) supply cells being isolated from one another by bus-cuts and contained in selected ones of the plurality of input/output cells; and
    a plurality of conduction and isolation circuits being interconnected between the plurality of (Vss) supply cells and the ESD bus die edge seal;
    whereby each of the plurality of (Vss) supply cells are separated from the ESD bus die edge seal by no more than a diode voltage difference.

12. An electrostatic discharge protected integrated circuit chip as recited in claim 11, wherein each of the plurality of conduction and isolation circuits is defined by a pair of cross-coupled diodes, and one of the pair of cross-coupled diodes produces the diode voltage difference.

13. An electrostatic discharge protected integrated circuit chip as recited in claim 12, wherein the integrated circuit chip is a multi-layer device that has one layer of the metallization ring on each layer of the multi-layer device.

14. An electrostatic discharge protected integrated circuit chip as recited in claim 13, wherein each layer of the metallization ring is electrically interconnected to one another via conductive vias, and a conductive contact electrically interconnects each layer of the metallization ring to a substrate of the integrated circuit chip.

15. An electrostatic discharge protected integrated circuit chip as recited in claim 11, wherein the plurality of (Vss) supply cells are selected from the group consisting of noisy Vss cells, quiet Vss cells, PCI Vss cells, SCSI Vss cells, and analog Vss cells.

16. An electrostatic discharge protected integrated circuit chip as recited in claim 11, wherein the ESD bus die edge seal has a width that is between about 4 microns and about 40 microns.

17. An electrostatic discharge protected integrated circuit chip as recited in claim 11, wherein:
    respective ones of the plurality of input/output cells contain input/output circuits; and
    the plurality of (Vss) supply cells are coupled to one or more ESD N-channel transistors.

18. An integrated circuit chip having a core logic region that includes a plurality of transistor devices that are interconnected to form a specific integrated circuit device, and a plurality of input/output cells that are defined along a periphery of the integrated circuit chip, comprising:

a single bus means for providing ESD protection and die sealing functions, the single bus means is defined around the periphery of the integrated circuit chip, the single bus means is positioned outside of the plurality of input/output cells closest to a physical outer edge of the integrated circuit chip;

a plurality of (Vss) supply cells contained in selected ones of the plurality of input/output cells; and a plurality of ESD cross-coupled diodes being connected between the plurality of (Vss) supply cells and the single bus means.

19. An integrated circuit chip as recited in claim 18, wherein selected ones of the plurality of (Vss) supply cells are connected to different internal Vss buses within the plurality of input/output cells to define different types of (Vss) supply cells.

20. An integrated circuit chip as recited in claim 19, wherein the different types of (Vss) cells are selected from a group consisting of a noisy Vss cell, a quiet Vss cell, a PCI Vss cell, a SCSI Vss cell, and an analog Vss cell.

21. An integrated circuit chip as recited in claim 20, wherein the different types of (Vss) cells are separated from one another by associated bus cuts.

22. An integrated circuit chip as recited in claim 18, wherein the plurality of (Vss) supply cells are electrically separated from the single bus means by no more than a diode voltage drop.

* * * * *